United States Patent
Outka et al.

(10) Patent No.: US 8,221,552 B2
(45) Date of Patent: Jul. 17, 2012

(54) CLEANING OF BONDED SILICON ELECTRODES

(75) Inventors: Duane Outka, Fremont, CA (US); Jason Augustino, Fremont, CA (US); Armen Avoyan, Glendale, CA (US); Stephen Whitten, Danville, CA (US); Hong Shih, Walnut, CA (US); Yan Fang, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 408 days.

(21) Appl. No.: 11/730,296

(22) Filed: Mar. 30, 2007

(65) Prior Publication Data

US 2008/0236618 A1    Oct. 2, 2008

(51) Int. Cl.
- B08B 17/02 (2006.01)
- B08B 3/04 (2006.01)
- B08B 5/02 (2006.01)
- B08B 1/04 (2006.01)

(52) U.S. Cl. .......... 134/3; 134/6; 134/21; 134/26; 134/28; 134/30

(58) Field of Classification Search ............ 134/2, 3, 134/34, 41, 42
See application file for complete search history.

(56) References Cited

U.S. PATENT DOCUMENTS

| | | | |
|---|---|---|---|
| 3,328,821 A * | 7/1967 | La Mura | 15/102 |
| 3,826,228 A * | 7/1974 | Glover | 118/255 |
| 4,713,119 A | 12/1987 | Earhart et al. | |
| 5,603,818 A * | 2/1997 | Brent et al. | 204/488 |
| 5,660,640 A | 8/1997 | Laube | |
| 6,003,526 A | 12/1999 | Lo et al. | |
| 6,148,765 A | 11/2000 | Lilleland et al. | |
| 6,376,385 B2 | 4/2002 | Lilleland et al. | |
| 6,376,977 B1 | 4/2002 | Kawai et al. | |
| 6,523,210 B1 * | 2/2003 | Andros | 15/102 |
| 6,607,605 B2 | 8/2003 | Tan | |
| 6,790,289 B2 | 9/2004 | Takase et al. | |
| 6,841,008 B1 | 1/2005 | Branco et al. | |
| 6,846,726 B2 * | 1/2005 | Ren et al. | 438/460 |
| 6,983,892 B2 | 1/2006 | Noorbakhsh et al. | |

(Continued)

FOREIGN PATENT DOCUMENTS

JP    02119224 A    5/1990

(Continued)

OTHER PUBLICATIONS

Yoshihide Shibanon, "Ultrasonic Cleaning Applications in the Semiconductor and Computer Industry", R&M Library Citation, Mar. 1994, (http://quanterion.com/RIAC/Library/Library.asp?ArgVal=45561-010).

(Continued)

*Primary Examiner* — Michael Kornakov
*Assistant Examiner* — Natasha Campbell
(74) *Attorney, Agent, or Firm* — Buchanan Ingersoll & Rooney PC

(57) ABSTRACT

Methods of cleaning plasma processing chamber components include contacting surfaces of the components with a cleaning solution, while avoiding damage of other surfaces or areas of the components by the cleaning solution. An exemplary plasma processing chamber component to be cleaning is an elastomer bonded electrode assembly having a silicon member with a plasma-exposed silicon surface, a backing member, and an elastomer bonding material between the silicon surface and the backing member.

20 Claims, 2 Drawing Sheets

U.S. PATENT DOCUMENTS

| | | |
|---|---|---|
| 7,052,553 B1 | 5/2006 | Shih et al. |
| 7,108,806 B2 | 9/2006 | Xiao et al. |
| 7,338,908 B1 * | 3/2008 | Koos et al. ............ 438/745 |
| 2002/0127853 A1 | 9/2002 | Hubacek et al. |
| 2003/0080333 A1 | 5/2003 | Yamaguchi et al. |
| 2003/0150476 A1 | 8/2003 | Suzuki |
| 2003/0221702 A1 | 12/2003 | Peebles |
| 2004/0045574 A1 | 3/2004 | Tan |
| 2004/0069320 A1 | 4/2004 | Bergman |
| 2004/0099285 A1 | 5/2004 | Wang et al. |
| 2004/0149699 A1 | 8/2004 | Hofman et al. |
| 2005/0181961 A1 * | 8/2005 | Misra et al. ............ 510/175 |
| 2005/0197266 A1 * | 9/2005 | Misra et al. ............ 510/175 |
| 2005/0274396 A1 | 12/2005 | Shih et al. |
| 2006/0138081 A1 | 6/2006 | Huang et al. |
| 2006/0141787 A1 | 6/2006 | Ren et al. |
| 2006/0141802 A1 | 6/2006 | Shih et al. |
| 2006/0157448 A1 | 7/2006 | Magni et al. |
| 2008/0125341 A1 | 5/2008 | Misra et al. |

FOREIGN PATENT DOCUMENTS

| | | |
|---|---|---|
| JP | 03162593 A | 7/1991 |
| JP | 2000-294527 A | 10/2000 |
| JP | 2002231699 A | 8/2002 |
| JP | 2006-196784 A | 7/2006 |
| WO | WO2006/071535 A2 | 7/2006 |

OTHER PUBLICATIONS

International Preliminary Report on Patentability dated Oct. 6, 2009 for International Application No. PCT/US2008/003972.

International Search Report and Written Opinion dated Jul. 30, 2008 for International Application No. PCT/US2008/003972.

Official Action dated Jun. 29, 2010 for Chinese Appln. No. 200880010263.3 (Partial English translation attached).

Official Action mailed Apr. 20, 2012 for Japanese Patent Appln. No. 2010-500978.

* cited by examiner

CLEANING OF BONDED SILICON ELECTRODES

FIELD OF THE INVENTION

The present invention relates to cleaning of a bonded electrode assembly of a plasma processing chamber.

BACKGROUND

A non-contiguous polymer deposit can form on the plasma-exposed surface, e.g., the bottom surface of a silicon upper electrode, during a main etching step for etching a dielectric material on a semiconductor substrate, such as silicon oxide or a low-k dielectric material layer.

Process window etch rate and etch uniformity can be restored to acceptable levels by cleaning the silicon surfaces of electrode assemblies.

The cleaning solution to be applied to the silicon surface of the electrode assembly comprise various reactive chemicals, for example, acids, such as hydrofluoric acid, to dissolve impurities. In particular, commonly owned U.S. Patent Application Publication Nos. 2006/0138081 A1, 2006/0141787 A1, and 2006/0141802 A1, which are incorporated herein by reference in their entirety, disclose acidic cleaning solutions for cleaning the silicon surfaces of electrode assemblies.

SUMMARY

Provided is a method of cleaning a bonded electrode assembly of a plasma processing chamber, the assembly comprising a silicon member having a plasma-exposed silicon surface, a backing member, and a bonding material between the silicon surface and the backing member. Gas holes extend through the backing member and silicon member. The method comprises contacting the silicon surface with a cleaning solution. The cleaning solution is prevented from damaging the backing member and/or bonding material by a method selected from the group consisting of: applying the cleaning solution to the silicon surface using one or more rollers that only contact the silicon surface; pressurizing the backing member while applying the cleaning solution to the silicon surface; applying a volume of the cleaning solution to the silicon surface such that the cleaning solution evaporates before capillary action draws the cleaning solution into gas holes in the silicon surface and in contact with the bonding material and/or backing member; applying corrosion inhibitor to the backing member and/or bonding material; and combinations thereof.

BRIEF DESCRIPTION OF THE DRAWING FIGURE

DETAILED DESCRIPTION

Figure 1:
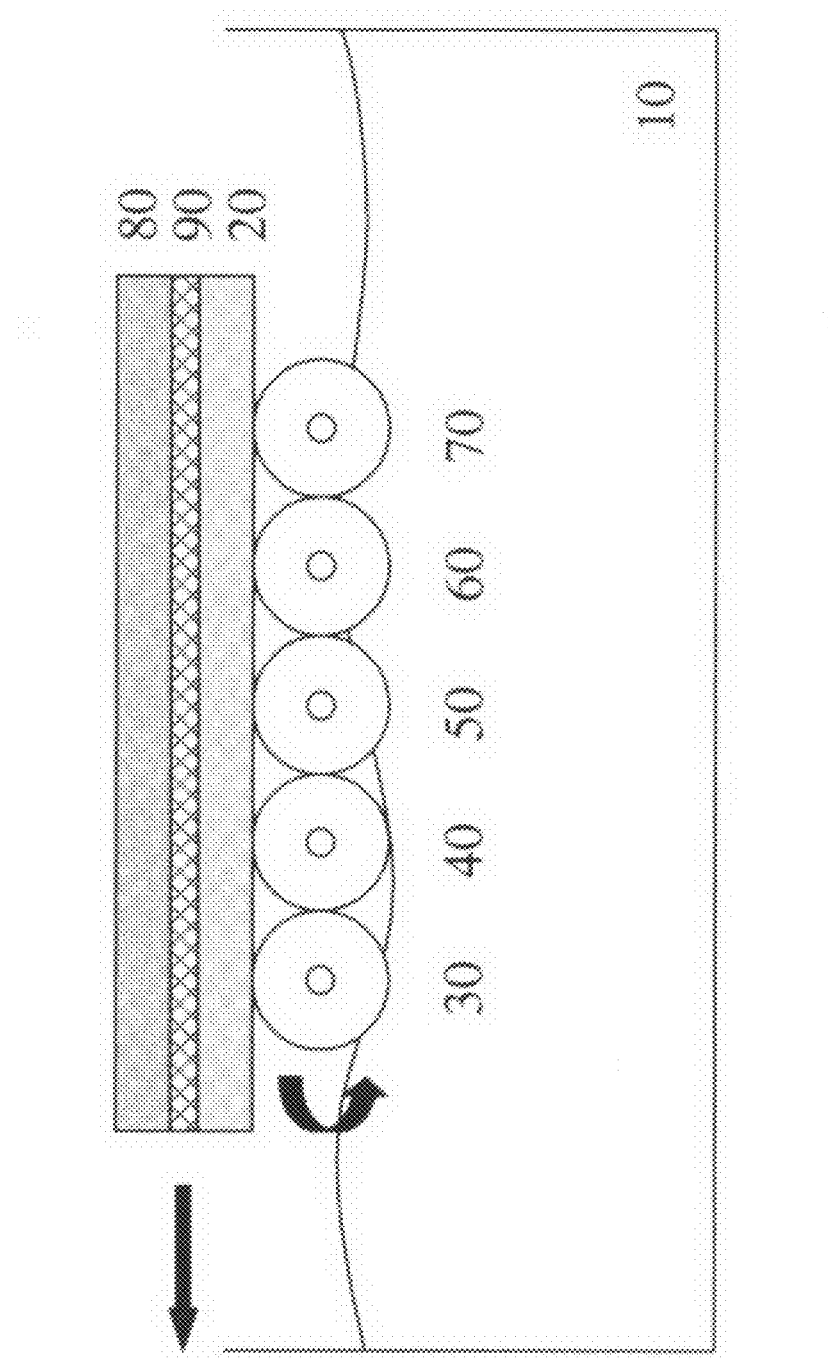
FIG. 1 shows an embodiment of applying a cleaning solution to a silicon surface of an electrode assembly using rollers that do not contact a backing member or bonding material of the electrode assembly.

Used silicon electrode assemblies exhibit etch rate drop and etch uniformity drift after a large number of RF hours (time in hours during which radio frequency power is used to generate the plasma) are run using the electrode assemblies, in part possibly due to the formation of black silicon. "Black silicon" can form on a plasma-exposed silicon surface as a result of the surface being micro-masked by contaminants deposited on the surface during plasma processing operations. Specific plasma processing conditions affected by the formation of black silicon include high nitrogen and low oxygen and $C_xF_y$ concentrations at moderate RF power, as used during etching of low-k dielectric vias. The micro-masked surface regions can be on the scale of from about 10 nm to about 10 microns. While not wishing to be bound to any particular theory, black silicon formation on the plasma-exposed surface of a silicon electrode is believed to occur as a result of non-contiguous polymer deposition on the silicon electrode during plasma processing operations. The decline of etch performance results from changes in the morphology of the silicon surface of the electrode assemblies as well as contamination of the silicon surface of the electrode assemblies, both of which are a product of the dielectric etch process.

A non-contiguous polymer deposit can form on the plasma-exposed surface, e.g., the bottom surface of a silicon upper electrode, during a main etching step for etching a dielectric material on a semiconductor substrate, such as silicon oxide or a low-k dielectric material layer. The polymer deposits typically form three-dimensional, island-like formations that selectively protect the underlying surface from etching. Once needle-like formations are formed, polymer deposits then form preferentially on the needle tips, thereby accelerating the micro-masking mechanism and black silicon propagation during the main etching step for successive substrates. The non-uniform, anisotropic etching of the micro-masked surface region(s) results in the formation of closely-spaced, needle-like or rod-like features on the surface. These features can prevent light from reflecting from the modified regions of the silicon surface, which causes those regions to have a black appearance. The needle-like micro features are closely spaced and can typically have a length of from about 10 nm (0.01 µm) to about 50,000 nm (50 µm) (and in some instances can have a length as high as about 1 mm or even greater), and can typically have a width of from about 10 nm to about 50 µm.

Process window etch rate and etch uniformity can be restored to acceptable levels by cleaning the silicon surfaces of electrode assemblies. In order to avoid damaging the backing member and/or bonding material of the electrode assembly, described below, the backing member and/or bonding material is preferably not contacted with the cleaning solution.

Dielectric etch systems (e.g., Lam 2300 Exelan®, Lam Exelan® HPT, and Lam 2300 Exelan® Flex™) may contain silicon showerhead electrode assemblies containing gas outlets. As disclosed in commonly owned U.S. Pat. No. 6,376,385, which is incorporated herein by reference in its entirety, an electrode assembly for a plasma reaction chamber, wherein processing of a semiconductor substrate, such as a single wafer, can be carried out, may include a backing member or ring, which may be made of, for example, graphite or aluminum, an electrode, such as a silicon showerhead electrode in the form of a circular disk, and an elastomeric joint between the backing member and the electrode. The elastomeric joint allows movement between the backing member and the electrode to compensate for thermal expansion as a result of temperature cycling of the electrode assembly. The elastomeric joint can include an electrically and/or thermally conductive filler and a catalyst-cured polymer which is stable at high temperatures. For example, the bonding material of the elastomeric joint (e.g., silicon-containing bonding material) may comprise silicone and aluminum alloy powder filler.

Additionally, an electrode assembly may comprise an outer electrode ring or member surrounding an inner electrode and optionally separated therefrom by a ring of dielectric material. The outer electrode member is useful for extending a single crystal silicon electrode to process larger wafers, such as 300 mm wafers. Similar to the inner electrode, the outer electrode member is preferably provided with a backing member, e.g., the outer ring may comprise an electrically grounded ring to which the outer electrode member may be elastomer bonded. The backing member of the inner electrode and/or outer electrode member may have mounting holes for mounting in a capacitively coupled plasma processing tool. Both the inner electrode and outer electrode member are preferably comprised of single crystal silicon, in order to minimize electrode assembly contaminants. The outer electrode member may be comprised of a number of segments (e.g., six segments) of single crystal silicon, arranged in an annular configuration, each of the segments being bonded (e.g., elastomer bonded) to a backing member. Further, adjacent segments in the annular configuration may be overlapping, with gaps or joints between the adjacent segments.

The cleaning solution to be applied to the silicon surface of the electrode assembly comprise various reactive chemicals, for example, acids, such as hydrofluoric acid, to dissolve impurities. In particular, commonly owned U.S. Patent Application Publication Nos. 2006/0138081 A1, 2006/0141787 A1, and 2006/0141802 A1, which are incorporated herein by reference in their entirety, disclose acidic cleaning solutions for cleaning the silicon surfaces of electrode assemblies.

The cleaning solution is prevented from damaging the backing member and/or bonding material by: applying the cleaning solution to the silicon surface using one or more rollers that only contact the silicon surface; pressurizing gas holes in the backing member while applying the cleaning solution to the silicon surface; applying a volume of the cleaning solution to the silicon surface such that the cleaning solution evaporates before capillary action draws the cleaning solution into gas holes in the silicon surface and in contact with the bonding material and/or backing member; applying corrosion inhibitor to the backing member and/or bonding material; and (e) combinations thereof.

In one embodiment, as shown in FIG. 1, when applying the cleaning solution 10 to the silicon surface 20 of the electrode assembly using rollers 30, 40, 50, 60, 70 that do not contact the backing member 80, or bonding material 90, the electrode assembly is preferably oriented with the silicon surface 20 facing downward during application of the cleaning solution 10 to the silicon surface 20 using the rollers 30, 40, 50, 60, 70, which contact the silicon surface 20, with the silicon surface 20 supported above an upper surface of the cleaning solution 10 on the rollers 30, 40, 50, 60, 70 and an opposing side of the rollers 30, 40, 50, 60, 70 contacting, or partially submersed in, the cleaning solution 10. The rollers are preferably coated with and/or made from a chemically resistant material, such as Teflon® (polytetrafluoroethylene) and/or polyvinyl alcohol, which are chemically resistant to acids.

Figure 2:
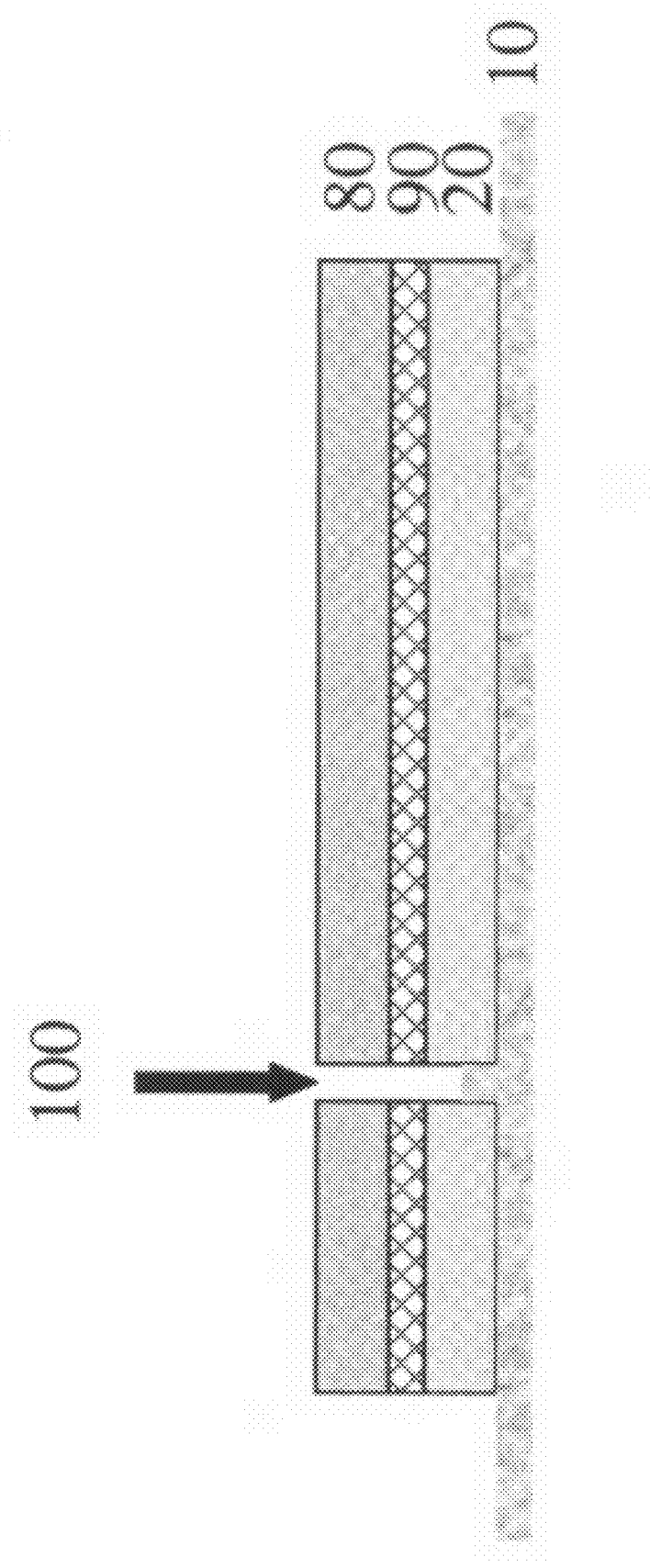
FIG. 2 shows an embodiment of pressurizing a backing member of an electrode assembly during application of a cleaning solution to a silicon surface of the electrode assembly.

In another embodiment, as shown in FIG. 2, the backing member 80 may be pressurized 100 during application of the cleaning solution 10 to the silicon surface 20. In particular, gas holes, through the backing member 80 and silicon surface 20 of the electrode assembly, are pressurized during application of the cleaning solution 10 to the silicon surface 20. More specifically, the method may include supporting the assembly in a fixture comprising a cover that has a gas inlet; sealing the cover on the assembly to provide an airtight region above a backside of the backing member and below a bottom of the cover; and providing gas to the airtight region through the gas inlet to pressurize gas holes in the backing member during application of the cleaning solution to the silicon surface.

The gas holes in the backing member 80 are preferably pressurized by a gas source 100 with air and/or nitrogen, for example, at a pressure of about 1-10 Cubic Feet per Minute (CFM). As shown in FIG. 2, sufficient pressure 100 may be applied to counteract capillary action that may draw the cleaning solution 10 into gas holes in the silicon surface 20. Alternatively, a steady stream of gas may be blown completely through the gas holes in the electrode assembly, such that gas enters the gas holes at the backing member and exits the gas holes at the silicon surface of the electrode assembly, to prevent any cleaning solution from being drawn into the gas holes in the silicon surface. Preferably, the cleaning solution 10 is applied to the silicon surface 20 by wiping, for example, using a wipe wetted with the cleaning solution, as opposed to allowing the silicon surface 20 of the electrode assembly to soak or rest in the cleaning solution 10.

In a further embodiment, the amount of cleaning solution applied to the silicon surface, preferably by wiping, may be limited, such that the volume of cleaning solution (e.g., isopropyl alcohol, ethyl alcohol, or other suitable solvent) applied to the silicon surface evaporates before capillary action may draw the cleaning solution into gas holes in the silicon surface. For example, a wipe wetted with a limited amount of cleaning solution may be wiped on the silicon surface.

In yet another embodiment, corrosion inhibitor may be applied to the backing member and/or bonding material. For example, the corrosion inhibitor preferably bonds to the backing plate (e.g., aluminum backing plate) and prevents cleaning solution from reacting with the surface of the backing plate and the interior of gas holes in the backing plate. The corrosion inhibitor is preferably selected from the group consisting of vanillin, amoxicillin, dicyandiamide, and mixtures thereof.

Aluminum weight loss tests were conducted with vanillin. First, a 0.2996 g aluminum coupon sample was immersed in a solution of 85 mL $H_2O$ and 15 mL 37% HCl for one hour, blown dry, and then weighed. After soaking, the aluminum coupon sample weighed 0.0621 g, meaning the acid bath resulted in a weight loss of 79.3%. Next, 4 g of vanillin was dissolved in 85 mL $H_2O$ and then 15 mL 37% HCl was mixed into the solution. A 0.2755 g aluminum coupon sample was immersed in the solution for one hour, blown dry, and then weighed. After soaking, the aluminum coupon sample weighed 0.2514 g, meaning the acid bath containing vanillin resulted in a weight loss of only 8.7%. In contrast to the aluminum weight loss tests, in which corrosion inhibitor was included in an acidic solution, cleaning solution is prevented from damaging the backing member and/or bonding material of a bonded electrode assembly by preferably applying corrosion inhibitor, in a separate step, to the backing member and/or bonding material prior to the cleaning solution being applied to the silicon surface.

Accidental contact of the cleaning solution with the backing member or bonding material is preferably avoided when wiping the cleaning solution on the silicon surface of the electrode assembly by contacting only the silicon surface of the electrode assembly with the cleaning solution and by means of a fixture that allows the silicon surface of the electrode assembly to be supported facing downward while the silicon surface is cleaned. The fixture, sized to the electrode assembly to be cleaned, has a sturdy base and three or more supporting members that raise the electrode assembly above the working bench surface, allowing the surface of the electrode assembly facing downward to be cleaned. The supporting members, and base, are preferably coated with and/or made from a chemically resistant material, such as Teflon® (polytetrafluoroethylene), which is chemically resistant to acids.

With the silicon surface of the electrode assembly supported facing downward, excess cleaning solution applied to the silicon surface can be collected after dripping off of the silicon surface, as opposed to flowing to the backing member or bonding material. The backing member and bonding material are preferably immediately cleaned with deionized water if contacted with the cleaning solution. Additionally, exposed electrode assembly bonding material may be protected by covering with masking material and/or chemical resistant tape prior to cleaning with the cleaning solution.

Additional measures to compensate for accidental contact of the cleaning solution with the backing member or bonding material include rinsing the electrode assembly with deionized water, ultrasonically cleaning with deionized water, and drying the electrode assembly. With the electrode assembly supported in a fixture with the silicon surface facing downward, the electrode assembly is preferably rinsed with deionized water from the backing member down to the silicon surface. If present, gas holes are also preferably rinsed with deionized water, which enters the gas holes at the backing member and exits the gas holes at the silicon surface of the electrode assembly, with the electrode assembly supported in a fixture with the silicon surface facing downward. Similarly, with the electrode assembly supported in a fixture with the silicon surface facing downward, the electrode assembly is preferably dried using compressed, filtered nitrogen gas, blown from the backing member down to the silicon surface. If present, gas holes are also preferably dried using compressed, filtered nitrogen gas, with the gas blown to enter the gas holes at the backing member and exit the gas holes at the silicon surface of the electrode assembly, with the electrode assembly supported in a fixture with the silicon surface facing downward. Finally, the electrode assembly is preferably oven baked prior to final inspection and packaging.

The electrode assembly is preferably inspected after cleaning to ensure that the cleaned electrode assembly conforms to product specifications. Inspection may include measuring, for example, dimensions (e.g., thickness), surface roughness (Ra, e.g., 16 μ-inches or less, preferably 8 μ-inches or less), surface cleanliness (Inductively Coupled Plasma Mass Spectrometry analysis), surface particle count as measured by, for example, a QIII®+Surface Particle Detector (Pentagon Technologies, Livermore, Calif.), surface morphology (e.g., by scanning electron microscopy (SEM)), and measurement of black silicon pits and etch depths. Further, plasma etch chamber performance of the recovered electrode assemblies are preferably tested to ensure that the recovered electrode assembly exhibits acceptable etch rate and etch uniformity.

While the present specification has made specific reference to elastomer bonded plasma processing chamber components, and more specifically, to an elastomer bonded electrode assembly, the presently disclosed methods are generally applicable to any component (e.g., an electrostatic chuck) containing surfaces to be cleaned with a solution (e.g., an acidic solution) to which other areas or surfaces of the component are sensitive.

While various embodiments have been described, it is to be understood that variations and modifications may be resorted to as will be apparent to those skilled in the art. Such variations and modifications are to be considered within the purview and scope of the claims appended hereto.

The invention claimed is:

1. A method of cleaning a bonded electrode assembly of a plasma processing chamber, the assembly comprising a silicon member having a plasma-exposed silicon surface, a backing member, and a bonding material between the silicon surface and the backing member and wherein gas holes extend through the backing member and silicon member, the method comprising:
  (a) applying a solution comprising a corrosion inhibitor to at least one of the backing members and the bonding material of the assembly;
  (b) contacting with a cleaning solution the silicon surface of the assembly;
  (c) preventing the cleaning solution from damaging the backing member and/or bonding material by applying the cleaning solution to the silicon surface using one or more rollers that only contact the silicon surface; and
  (d) the corrosion inhibitor protecting at least one of the backing member and bonding material from reacting with the cleaning solution being applied to the silicon surface.

2. The method of claim 1, wherein the backing member comprises an aluminum backing member and the corrosion inhibitor is applied to the aluminum backing member.

3. The method of claim 1, wherein the backing member comprises graphite.

4. The method of claim 1, wherein the bonding material comprises an elastomer bonding material.

5. The method of claim 1, wherein the bonding material comprises silicon polymer and aluminum alloy powder filler and the corrosion inhibitor is applied to the bonding material.

6. The method of claim 1, wherein the cleaning solution comprises an acidic solution.

7. The method of claim 1, wherein the cleaning solution comprises hydrofluoric acid.

8. The method of claim 1, wherein the assembly is oriented with the silicon surface facing downward during application of the cleaning solution to the silicon surface.

9. The method of claim 8, further comprising:
  supporting the assembly in a fixture comprising a cover, wherein the cover comprises a gas inlet;
  sealing the cover on the assembly to provide an airtight region above a backside of the backing member and below a bottom of the cover; and
  providing gas to the airtight region through the gas inlet to pressurize the backing member during application of the cleaning solution to the silicon surface.

10. The method of claim 9, wherein the gas is selected from the group consisting of air, nitrogen, and mixtures thereof.

11. The method of claim 9, wherein sufficient pressure is applied to counteract capillary action that may draw the cleaning solution into gas holes in the silicon surface.

12. The method of claim 9, wherein a steady stream of gas is blown through gas holes in the electrode assembly.

13. The method of claim 12, wherein about 1-10 CFM of gas is applied to the backing member.

14. The method of claim 1, wherein the backing member comprises aluminum and the corrosion inhibitor inhibits corrosion of aluminum.

15. The method of claim 1, wherein the corrosion inhibitor is selected from the group consisting of vanillin, amoxicillin, dicyandiamide, and mixtures thereof.

16. The method of claim 8, further comprising supporting the silicon surface above an upper surface of the one or more rollers and wherein an opposing surface of the one or more rollers is in contact and/or partially submersed in the cleaning solution.

17. A method of cleaning a bonded electrode assembly of a plasma processing chamber, the assembly comprising a silicon member having a plasma-exposed silicon surface, a backing member, and a bonding material between the silicon surface and the backing member and wherein gas holes extend through the backing member and silicon member, the method comprising:
- applying a solution comprising a corrosion inhibitor to at least one of the backing member and bonding material;
- contacting with a cleaning solution the silicon surface of the assembly;
- preventing the cleaning solution from damaging the backing member and/or bonding material by orientating the silicon surface of the assembly in a downward facing direction and applying the cleaning solution to the silicon surface using one or more rollers that only contact the silicon surface;
- supporting the silicon surface above an upper surface of the one or more rollers and wherein an opposing surface of the one or more rollers is in contact and/or partially submersed in the cleaning solution; and
- the corrosion inhibitor protecting at least one of the backing member and bonding material from reacting with the cleaning solution being applied to the silicon surface.

18. The method of claim 8, wherein the cleaning solution is applied to the silicon surface using two or more rollers that contact the silicon surface.

19. The method of claim 18, wherein the silicon surface is supported above an upper surface of the cleaning solution on the rollers and part of the rollers is immersed in the cleaning solution.

20. The method of claim 19, wherein the rollers are coated with and/or made from polytetrafluoroethylene and/or polyvinyl alcohol.